United States Patent
DeForge et al.

(10) Patent No.: US 9,673,116 B2
(45) Date of Patent: Jun. 6, 2017

(54) ON CHIP ELECTROSTATIC DISCHARGE (ESD) EVENT MONITORING

(71) Applicant: International Business Machines Corporation, Armonk, NY (US)

(72) Inventors: John B. DeForge, Barre, VT (US); Junjun Li, Williston, VT (US); Alain F. Loiseau, Williston, VT (US); Kirk D. Peterson, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 1012 days.

(21) Appl. No.: 13/733,954

(22) Filed: Jan. 4, 2013

(65) Prior Publication Data

US 2014/0191778 A1    Jul. 10, 2014

(51) Int. Cl.
   *G01R 31/02* (2006.01)
   *H01L 21/66* (2006.01)
   (Continued)

(52) U.S. Cl.
   CPC ............ *H01L 22/34* (2013.01); *G01R 31/002* (2013.01); *G01R 31/2884* (2013.01)

(58) Field of Classification Search
   CPC ......... H01L 2924/00; H01L 2924/0002; H01L 2924/00014; H01L 22/34; G01R 31/002;
   (Continued)

(56) References Cited

U.S. PATENT DOCUMENTS 5,835,327 A   11/1998  Siew et al.
6,614,235 B2   9/2003  Kraz
(Continued)

FOREIGN PATENT DOCUMENTS

CN    1160789 C   8/2004
TW    465070     11/2001

OTHER PUBLICATIONS

Dashupta, A. et al.; "The Use of "Canaries" for Adaptive Health Management of Electronic Systems"; Adaptive 2010: The Second International Conference on Adaptive and Selt-Adaptive Systems and Applications; pp. 176-183; Copyright (c) IARIA 2010.
(Continued)

*Primary Examiner* — Daniel Miller
(74) *Attorney, Agent, or Firm* — Arnold B. Bangali

(57) ABSTRACT

An approach for monitoring electrostatic discharge (ESD) event of an integrated circuit. The approach includes a canary device for exhibiting an impedance shift when affected by an ESD pulse, wherein circuit drain of the canary device is connected to an input terminal of the circuit structure. The approach further includes circuit source and logic gates of the canary device, connected to a circuit drain of ESD transistor of the circuit structure, wherein circuit source of the ESD transistor is connected to an output terminal of the circuit structure. The approach further includes a logic gate of the ESD transistor, connected to an enable signal of the circuit structure, and wherein the enable signal is connected to the output terminal through a capacitor of the circuit structure. In addition, the enable signal is also connected to the input terminal through a resistor of the circuit structure.

12 Claims, 3 Drawing Sheets

(51) Int. Cl.
*G01R 31/00* (2006.01)
*G01R 31/28* (2006.01)

(58) Field of Classification Search
CPC .............. G01R 31/001; G01R 19/0053; G01R 31/2884
USPC ......................... 324/457, 537, 750.3, 762.02
See application file for complete search history.

(56) References Cited

U.S. PATENT DOCUMENTS

| | | |
|---|---|---|
| 7,929,117 B2 | 4/2011 | Anderson et al. |
| 2003/0006776 A1 | 1/2003 | Wendel et al. |
| 2008/0145958 A1 | 6/2008 | Abou-Khalil et al. |
| 2010/0051502 A1 | 3/2010 | Cybulski et al. |
| 2010/0225347 A1 | 9/2010 | Worley et al. |
| 2012/0176710 A1* | 7/2012 | Domanski .......... H01L 27/0285 361/56 |

OTHER PUBLICATIONS

Jack, N and Rosenbaum, E.; "Voltage Monitor Circuit for EDS Diagnosis"; Dept. of Electrical and Computer Engineering; University of Illinois at Urbana-Champaign, Urbana, IL.

* cited by examiner

ON CHIP ELECTROSTATIC DISCHARGE (ESD) EVENT MONITORING

FIELD OF THE INVENTION

The present invention relates generally relates to integrated circuits, and more particularly to a circuit structure for monitoring an electrostatic discharge (ESD) event by utilizing a canary device of the circuit structure.

BACKGROUND OF THE INVENTION

Integrated circuits (ICs) such as processors continue to operate at faster and faster clock speeds. Furthermore, the size of ICs continues to decrease. However, it is becoming easier to either completely destroy or otherwise impair components of ICs due to the decreased size of the ICs. In addition, ICs can be highly susceptible to damage from the discharge of static electricity due to decreased size of the IC. For instance, electrostatic discharge (ESD) is the transfer of an electrostatic charge between bodies at different electrostatic potentials or voltages. Moreover, the transferred electrostatic charge can be caused by direct contact to the IC or it can also be induced by an electrostatic field that can potentially damage components of the IC.

SUMMARY

In one embodiment of the present invention, a circuit structure is provided for monitoring an electrostatic discharge (ESD) event in a manufacturing environment of an integrated circuit package. The circuit structure comprises a canary device for exhibiting an impedance shift when affected by an ESD pulse of the ESD event, wherein circuit drain of the canary device is connected to an input terminal of the circuit structure. In one embodiment, circuit source and logic gates of the canary device are connected to a circuit drain of ESD transistor of the circuit structure, wherein circuit source of the ESD transistor is connected to an output terminal of the circuit structure, wherein logic gate of the ESD transistor is connected to an enable signal of the circuit structure, and wherein the enable signal is connected to the VSS terminal through a capacitor of the circuit structure, and wherein the enable signal is also connected to the input terminal through a resistor of the circuit structure.

In another embodiment, a method for monitoring electrostatic discharge (ESD) events in a manufacturing environment of an integrated circuit package. The method comprises a circuit structure, and a canary device for exhibiting an impedance shift when affected by an ESD pulse. In one embodiment, circuit drain of the canary device is connected to an input terminal of the circuit structure. In addition, circuit source and logic gates of the canary device are connected to a circuit drain of ESD transistor of the circuit structure, wherein circuit source of the ESD transistor is connected to an output terminal of the circuit structure, wherein logic gate of the ESD transistor is connected to an enable signal of the circuit structure, and wherein the enable signal is connected to the output terminal through a capacitor of the circuit structure, and wherein the enable signal is also connected to the input terminal through a resistor of the circuit structure.

BRIEF DESCRIPTION OF THE SEVERAL VIEWS OF THE DRAWINGS

Novel characteristics of the invention are set forth in the appended claims. The invention itself, however, as well as preferred mode of use, further objectives, and advantages thereof, will be best understood by reference to the following detailed description of the invention when read in conjunction with the accompanying Figures, wherein, like reference numerals indicate like components, and:

DETAILED DESCRIPTION

Embodiments of the present invention comprise one or more circuits or subassemblies of circuits as well as methods of operation, adapted to provide functionalities for monitoring and storing ESD events during operation of an integrated circuit (IC). According to embodiments of the invention, additional structures are provided to input/output (I/O), power pins (VDD), and ground (GND) terminals of the IC to monitor the ESD event, even if magnitude of the ESD event is insufficient to render the IC non-functional.

In one embodiment, the IC circuit includes one or more sacrificial devices that are intentionally designed to fail at lesser conditions than the other devices of the IC, these sacrificial devices are know as canary devices. According to the present invention, the one or more canary devices are more sensitive to adverse conditions than the other devices of the IC. Specifically, the one or more canary devices are extra sensitive to ESD pulse of ESD events than other components of IC, such that electrical characteristics of the one or more canary devices are modified by the ESD event. In one aspect, modification of the one or more canary devices by the ESD event allows detection and monitoring of ESD pulses of lower intensities on the IC, as described in more detailed below, in accordance with the present invention.

Figure 1:
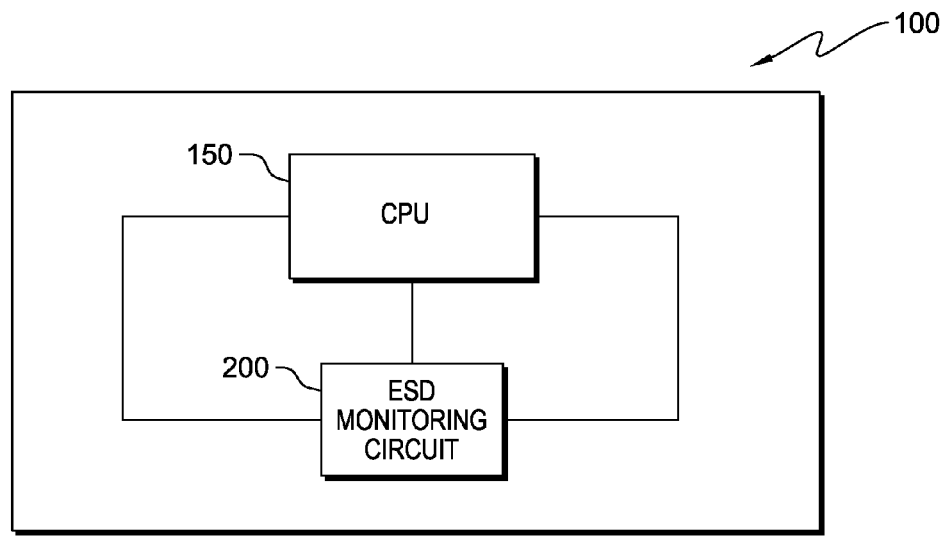
FIG. 1 illustrates an integrated circuit including an electrostatic discharge (ESD) monitoring circuit for monitoring ESD events of the integrated circuit, in accordance with embodiments of the present invention.

Further aspects of the present invention will now be described in conjunction with the Figures. Referring now to FIG. 1, an integrated circuit (IC) 100 including ESD monitoring circuit 200 for monitoring ESD events of IC 100 is shown, in accordance with embodiments of the present invention.

IC 100 comprises a set of circuits and subassemblies that can be susceptible to potential negative circuit effects that can be caused by ESD events. IC 100 includes central processing unit (CPU) 150 and ESD monitoring circuit 200. CPU 150 executes program instructions on IC 100. ESD monitoring circuit 200 comprises an ESD monitor structure that includes sensitive circuit elements, including, for example, one or more canary devices for exhibiting an impedance shift when affected by an ESD pulse of the ESD event. In one aspect of the present invention, IC 100 can include additional circuits or components not depicted.

Figure 2:
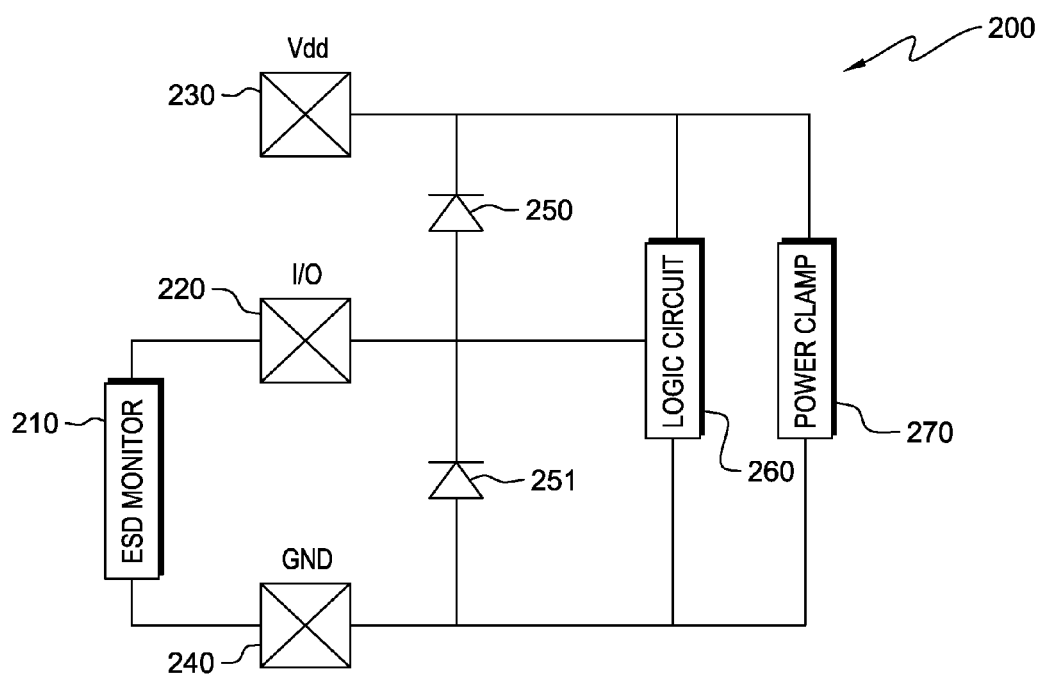
FIG. 2 illustrates an ESD monitoring circuit for monitoring ESD events of an integrated circuit, in accordance with an embodiment of the present invention.

FIG. 2 illustrates ESD monitoring circuit 200 for monitoring ESD events in IC 100 of FIG. 1, in accordance with embodiments of the present invention.

ESD monitoring circuit 200 includes an ESD monitor structure that has a high impedance measure that is transparent to functions of ESD monitoring circuit 200, during normal operation of IC 100. The ESD monitor structure is adapted to sensitively monitor and detect ESD events of ESD monitoring circuit 200. In other aspects of the present invention, characteristics of the ESD monitor structure are modified by the ESD event. In particular, ESD monitoring circuit 200 comprises sensitive circuit elements, including, for example, field effect transistor (FET) (NFET, PFET, or thin or thick oxide transistors with varied lengths), or any other circuit elements that exhibits a large impedance shift when affected by an ESD pulse of the ESD event, in accordance with embodiments of the present invention. ESD monitoring circuit 200 comprises ESD monitor 210, logic circuit 260, and power clamp 270. ESD monitoring circuit 200 further comprises a plurality of IC pads including, for example, power (Vdd) pad 230, ground (Gnd) pad 240, and I/O pad 220. In the depicted embodiment, ESD monitor 210 experiences large impedance during normal operation of ESD monitoring circuit 200 in conjunction with the ESD discharging devices. Diodes 250, 251 and power clamp 270 provide an electrical path to discharge the ESD pulse.

Furthermore, Vdd pad 230 provides power to logic circuit 260. Information is transmitted to logic circuit 260 via I/O pad 220. The impedance is a measure of opposition that ESD monitor 210 presents to a passage of current on ESD monitoring circuit 200, when voltage is applied to power Vdd pad 230. The large impedance of ESD monitor 210 or its impedance change does not impact normal function of logic circuit 260. For example, during an ESD event on IC circuit 100, an ESD pulse of the ESD event is stresses ESD monitor 210, in accordance with at least one embodiment of the present invention. In particular, the ESD pulse of ESD monitor 210 modifies some of the electrical characteristics of ESD monitor 210 during the ESD event, thereby allowing ESD monitor 210 to record ESD pulse measurements of the ESD event. In another aspect, ESD monitor 210 operates in a manner that enables drain of a field effect transistor (NFET) of ESD monitoring circuit 200 to connect to a terminal of I/O pad 220, while source and logic gates of the NFET are connected to the drain of an ESD NFET (depicted in FIG. 3 and discussed in detail below). In particular, the NFET is a field effect transistor that uses an electrical field to control the shape and conductivity of a channel of a charge carrier in ESD monitoring circuit 200. Furthermore, a source of the ESD NFET is grounded while its logic gate is connected to an enable operation of the logic gate of the ESD monitoring circuit 200.

Logic circuit 260 is any microelectronic circuit or device that typically includes at least one or more of transistors, capacitors, inductors, resistors, diodes, insulators or conductors that collaboratively performs one or more operations within IC circuit 100. According to one aspect, logic circuit 260 can be a subassembly circuit of IC circuit 100. Furthermore, logic circuit 260 can also include power supplies and one or more I/O devices that collaboratively perform the one or more operations of IC 100.

In one embodiment of the present invention, ESD monitor 210 operates to monitor, and detect ESD events on logic circuit 260. For example, logic circuit 260 can be a central processing unit (CPU) or computer data storage. The computer data storage can generally be technology consisting of read-write random-access memory (RAM), including for example, DRAM (Dynamic-RAM) or other forms of fast, but temporary memory storage units. According to embodiments of the present invention, logic circuit 260 does not include flash memory or operate with flash memory. Power clamp 270 is a resistor-capacitor clamp of an ESD monitoring structure of ESD monitoring circuit 200. In particular, power clamp 270 provides a discharge path between Vdd pad 230 and Gnd pad 240. In one aspect, during normal operation of ESD monitoring circuit 200, power clamp 270 is off, and has high impedance. Alternatively, in another aspect, during occurrence of the ESD event, power clamp 270 is actively powered on, and discharges the ESD event, in accordance with embodiments of the present invention.

Figure 3:
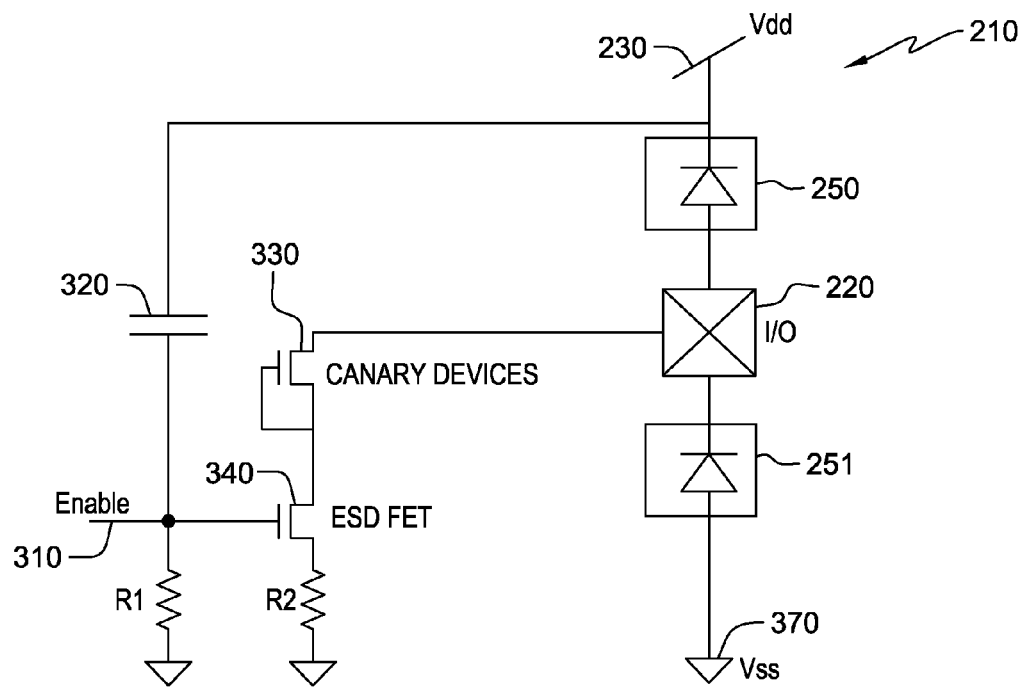
FIG. 3 illustrates an alternative embodiment of an ESD monitoring circuit for monitoring ESD events in an integrated circuit, in accordance with embodiments of the present invention.

FIG. 3 illustrates an embodiment of ESD monitor 210 of ESD monitoring circuit 200 for monitoring ESD events in IC 100, in accordance with an embodiment of the present invention.

In the depicted embodiment, ESD monitor 210 includes enable 310, capacitor 320, canary device 330, ESD FET 340, a plurality of resistors, including, R1 and R2, junction diodes 250, 251 and negative supply voltage (Vss) 370. In one aspect, ESD monitor 210 operates under varied conditions to monitor and detect ESD events, as described below. Enable 310 enables drain of ESD FET 340 to connect to a terminal of I/O pad 220. Diodes 250, 251 are p-n junction diodes connected to I/O pad 220 and Vss 370, wherein the connected diodes 250, 251 allow the ESD pulse to be discharged. Furthermore, capacitor 320 can be connected to I/O pad 220 if there were no "up-diode", in accordance with embodiments of the present invention.

According to one aspect of the present invention, during a positive ESD event a large ESD current is discharged through diodes 250, 251 to power Vdd 230, thus increasing voltage on ESD monitor 210. In particular, during the ESD event, ESD FET 340 is active or powered on, and voltage is transmitted to canary device 330. In this manner, capacitor 320 transmits the increased voltage to enable 310, which activates ESD FET 340. In one embodiment, with ESD FET 340 turned on, the transmitted increased voltage drops across ESD monitor 210. In one aspect, the dropped voltage exposes canary device 330 to voltage from I/O pad 220. In this manner, if the dropped voltage is too large, it will modify characteristics of canary device 330 of ESD monitor 210.

According to another aspect, during test operation of ESD monitor 210, ESD FET 340 is actively turned on, thus exposing impedance of canary device 330 between I/O pad 220 and GND 240 of FIG. 1 to the ESD event. In particular, during test operation, enable 310 turns on ESD FET 340 to active, and thus, a damaged or destroyed canary device 330 produces leaked current, wherein the leaked current can be detected based on poor functionality operations of ESD monitor 210.

In one embodiment, if canary device 330 hasn't been damaged by an ESD pulse of the ESD event, the impedance of canary device 330 is large, and it consequently operates as an off NFET. Alternatively, if canary device 330 is exposed to the ESD event, and thus, damaged, it will produce leakage of current on ESD monitor 210. In another embodiment, the value or measurement of the leaked current represents whether I/O pad 220 of ESD monitor 210 is exposed to the ESD event.

According to yet another aspect, during normal operation of ESD monitor 210, ESD FET 340 is off or inactive such that leaked current from I/O pad 220 to GND 240 through ESD FET 340 and canary device 330 is negligible. For example, the leaked current during normal operation ensures that event if canary devices 330 were damaged by the ESD event during normal operation, the damaged devices will not affect functionality or operation of logic circuit 330. According to yet another aspect, during time constants operation of ESD monitor 210, measurements or numerical values of R1, R2 and capacitor 320 have to be selected such that during the ESD event enable 310 is active or high. For example, calculated or multiplied measurements of R1, R2 and capacitor 320 that is greater than 10 ns can transmit a signal to enable 310 and turn it on to active or high. In another example, 50 ns can be achieved with a resistor of 500 kohms and a capacitor of 100 fF.

Figure 4:
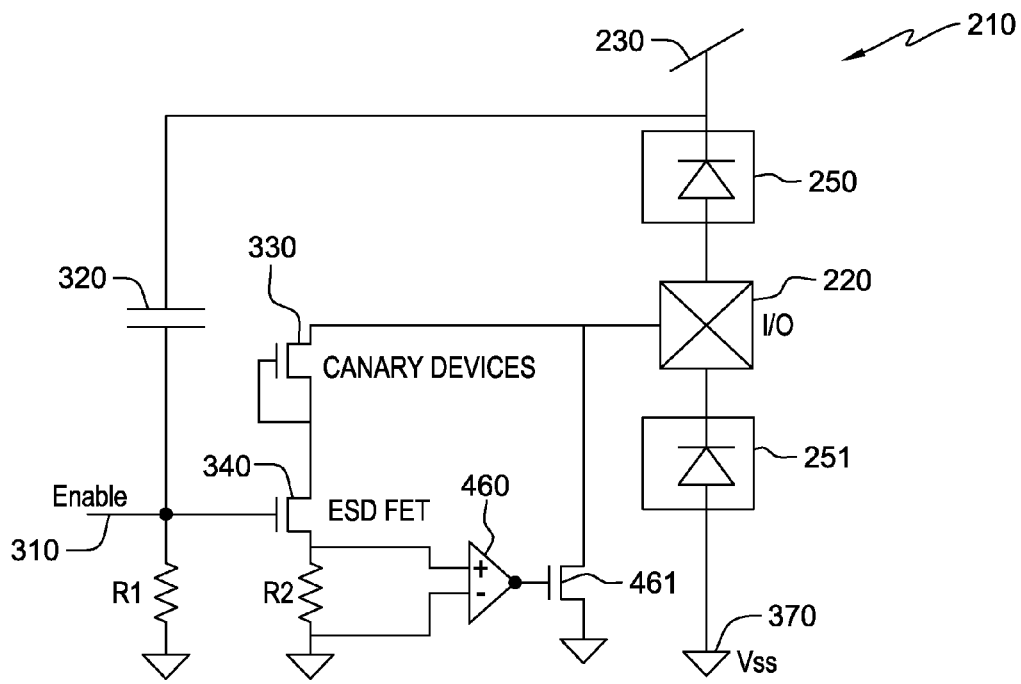
FIG. 4 illustrates an ESD monitoring circuit with an amplified leakage of a canary device, in accordance with embodiments of the present invention.

FIG. 4 illustrates an alternative embodiment of ESD monitor 210 with an amplified leakage of canary device 330, in accordance with an embodiment of the present invention. As illustrated, leakage of ESD monitor 210 is amplified to ensure I/O pad 220 losses functionality when canary device 330 leaks or is damaged. In particular, to simplify testing of ESD monitor 210, leakage flows through canary device 330 and ESD FET 340 by feeding voltage drop across R2 to amplifier 460.

The dropped voltage through amplifier 460 allows amplifier 460 to control a gate of NFET 461 of ESD monitor 210, wherein NFET 461 can be connected between I/O pad 220 and GND 240. Furthermore, in the event that canary device 330 is damaged, and in the event that enable 310 is on and active, current flowing through NFET 461 will cause functional failure to components of ESD monitoring circuit 200, in accordance with embodiments of the present invention.

Figure 5:
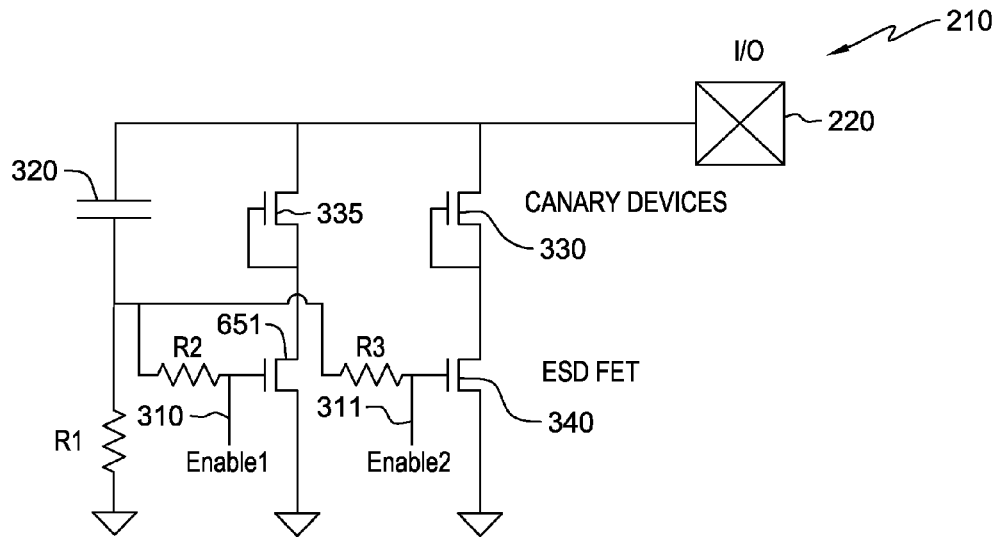
FIG. 5 illustrates an ESD monitoring circuit with multiple monitoring structures for monitoring ESD events, in accordance with an embodiment of the present invention.

FIG. 5 illustrates an alternative embodiment of ESD monitor 210 with multiple monitoring structures, in accordance with an embodiment of the present invention.

In one embodiment, multiple monitoring structures are added to ESD monitoring circuit 200 to detect and distinguish one or more ESD events on ESD monitoring circuit 200. In one aspect, the one or more ESD events operate with various magnitudes that can damage or affect operation of IC 100. In particular, two canary devices, including, canary device 330 and canary device 335 are added to ESD monitoring circuit 200, to detect and distinguish the one or more ESD events. In one embodiment, canary device 330 can be more sensitive in detecting the ESD event. In this manner canary device utilizes different NFETs on ESD monitoring circuit 200, or by changes the gate length of ESD monitoring circuit 200. Furthermore, in the depicted embodiment, two enable nodes, enable 310 and enable 311, are also provided on ESD monitoring circuit 200 such that during test of the ESD event, each canary device, canary device 330 and canary device 335 can be tested separately, in accordance with embodiments of the present invention. In addition, R3 is connected to enable 311.

In one embodiment, canary device 330 and canary device 335 can be metal oxide field effect transistor (FET). The FET can be used to amplify or switch signals on ESD monitoring circuit 200 during the test of ESD event. Canary device 330 and Canary device 335 can also be a capacitor, diode, or a bipolar junction transistor (BJT). The BJT can also be used as an amplifier, switch, or an oscillator on ESD. As depicted, ESD monitor 210 includes ESD FET 651.

Figure 6:
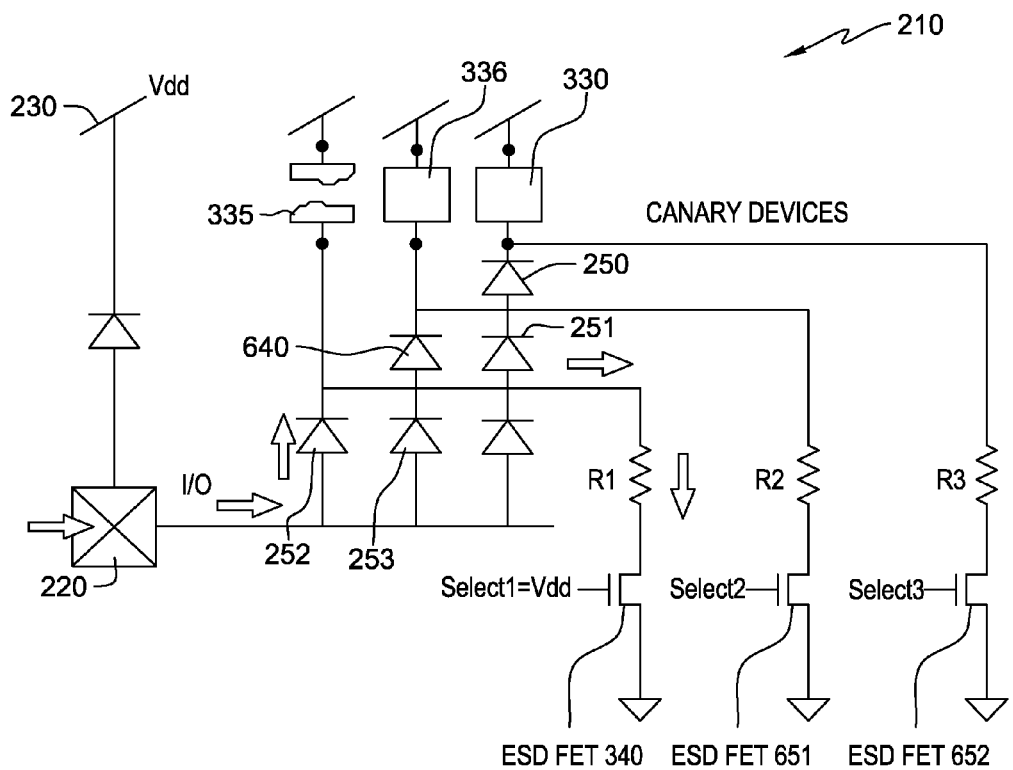
FIG. 6 illustrates an ESD monitoring circuit with a canary device fused during an ESD event, in accordance with an embodiment of the present invention.

FIG. 6 illustrates an alternative embodiment of ESD monitor 210 with canary device fused during an ESD event, in accordance with an embodiment of the present invention. In the depicted embodiment, canary device 335 is a conductor, acting as a fuse during the ESD event on ESD monitor 210. In one aspect, multiple ESD levels are detected, wherein a weak ESD pulse of the ESD event will only be able to turn on one diode, including for example, diode 250, and hence fuse only the first canary device, in this case, canary device 335. On the other hand, a larger pulse turns on two diodes, including, for example, diode 250 and diode 251 and fuses a second canary device, in this case canary device 336. In another aspect, a fused canary device 335 allows easy progression of ESD sensitivity by number of diodes 250, 251, 252, 253, 630, and 640, in accordance with embodiments of the present invention.

Embodiments of the present invention provide circuits or subassemblies of circuits, as well as, methods of operation, adapted to monitoring an electrostatic discharge (ESD) event in an IC by utilizing one or more canary devices of the IC. In one aspect, embodiments of the present invention can take the form of an entirely hardware embodiment, or an embodiment including both hardware and software aspects that can generally be referred to herein as a "circuit" or "system". In one embodiment, the present invention is implemented in hardware. The software can include but it is not limited to firmware, resident software, microcode, etc. In particular, those skilled in the arts can recognize that functions of circuits or subassemblies of circuits described in accordance with embodiments of the present invention can be accomplished via other means. In addition, the foregoing description of various aspects of the present invention has been presented for purposes of illustration and description. It is not intended to be exhaustive or to limit the invention to the precise form disclosed and many modifications and variations are possible.

What is claimed is:

1. A circuit structure for monitoring an electrostatic discharge (ESD) event in a manufacturing environment of an integrated circuit package, the circuit structure comprising:
   a canary device for exhibiting an impedance shift when affected by an ESD pulse of the ESD event,
   wherein a circuit drain of the canary device is connected to an input terminal of the circuit structure; and
   wherein a circuit source and a logic gate of the canary device are connected to a circuit drain of an ESD transistor of the circuit structure, wherein a circuit source of the ESD transistor is connected to an output terminal of the circuit structure, wherein a logic gate of the ESD transistor is connected to an enable line of the circuit structure, and wherein the canary device is connected in series with one or more diodes of the circuit structure.

2. The circuit structure according to claim 1, wherein the circuit structure comprises multiple canary devices for monitoring the ESD event in the integrated circuit package.

3. The circuit structure according to claim 1, wherein the integrated circuit includes any memory storage.

4. The circuit structure according to claim 1 further comprising a power clamp.

5. The circuit structure according to claim 4, wherein the power clamp is an ESD structure that is used to create current discharge path during an ESD event between input and output terminal of the circuit structure.

6. The circuit structure according to claim 1, wherein the circuit structure amplifies leakage of current to the canary device, and wherein the leaked current is amplified to ensure that an input terminal of the integrated circuit loses functionality when the leaked current flows through the canary device.

7. A method for monitoring electrostatic discharge (ESD) event in a manufacturing environment of an integrated circuit package, the method comprising:

exhibiting an impedance shift when affected by an ESD pulse of the ESD event of a canary device of a circuit structure, wherein a circuit drain of the canary device is connected to an input terminal of the circuit structure, and wherein a circuit source and a logic gate of the canary device are connected to a circuit drain of an ESD transistor of the circuit structure, wherein a circuit source of the ESD transistor is connected to an output terminal of the circuit structure, wherein a logic gate of the ESD transistor is connected to an enable line of the circuit structure, wherein the canary device is connected in series with one or more diodes of the circuit structure.

8. The method according to claim 7, wherein the circuit structure comprises multiple canary devices for monitoring the ESD event in the integrated circuit package.

9. The method according to claim 7, wherein the integrated circuit includes any memory storage.

10. The method according to claim 7, further comprising a power clamp.

11. The circuit structure according to claim 10, wherein the power clamp is an ESD structure that is used to create current discharge path during an ESD event between input and output terminal of the circuit structure.

12. The method according to claim 7, wherein the circuit structure amplifies leakage of current to the canary device, and wherein the leaked current is amplified to ensure that an input terminal of the integrated circuit loses functionality when the leaked current flows through the canary device.

* * * * *